United States Patent [19]

Sugden

[11] 4,345,809
[45] Aug. 24, 1982

[54] CIRCUIT BOARD EJECTOR AND GUIDE

[76] Inventor: Mary L. Sugden, 58 Michael Way, Santa Clara, Calif. 95051

[21] Appl. No.: 157,885

[22] Filed: Jun. 9, 1980

[51] Int. Cl.³ ............................................. H01R 13/62
[52] U.S. Cl. ................................................. 339/45 M
[58] Field of Search ................. 339/45 R, 45 M, 45 T

[56]  References Cited
U.S. PATENT DOCUMENTS

| | | | |
|---|---|---|---|
| 3,150,906 | 9/1964 | Chambon et al. | 339/45 M |
| 3,784,954 | 1/1974 | Grimm et al. | 339/45 M X |
| 4,178,051 | 12/1979 | Kocher et al. | 339/45 M |

Primary Examiner—Joseph H. McGlynn
Assistant Examiner—Frank H. McKenzie, Jr.
Attorney, Agent, or Firm—Thomas H. Olson

[57] ABSTRACT

A circuit board ejector mountable on opposite ends of a circuit board connector for guiding the circuit board into the connector and for facilitating ejection of the circuit board from the connector. The ejector includes a rigid elongate body in which is formed a channel groove aligned with the connector so that movement of the circuit board along the channel groove guides the circuit board into the connector. Supported for pivotal movement on the body is a lever which has a portion that engages a shoulder on the circuit board. The lever has an externally accessible handle portion. Movement of the handle portion urges the shoulder engaging members against the shoulder and moves the circuit board outward of the connector where it is supported by the channel grooves and the body.

4 Claims, 2 Drawing Figures

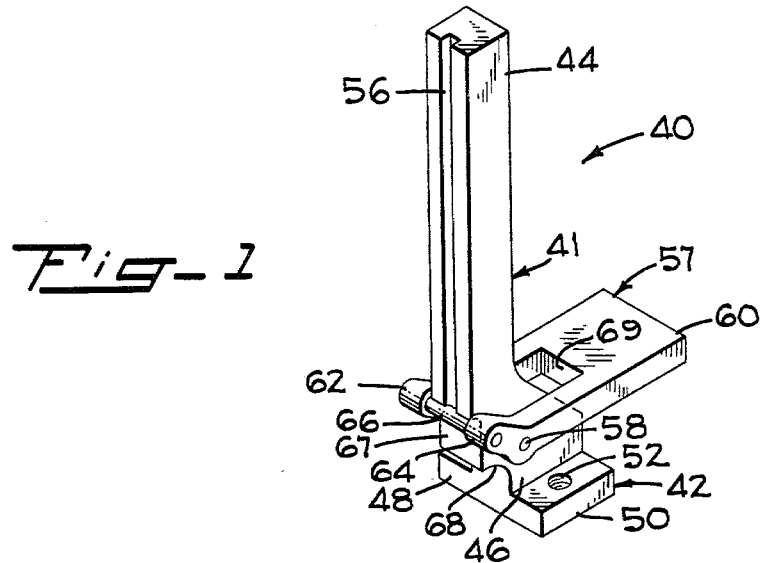
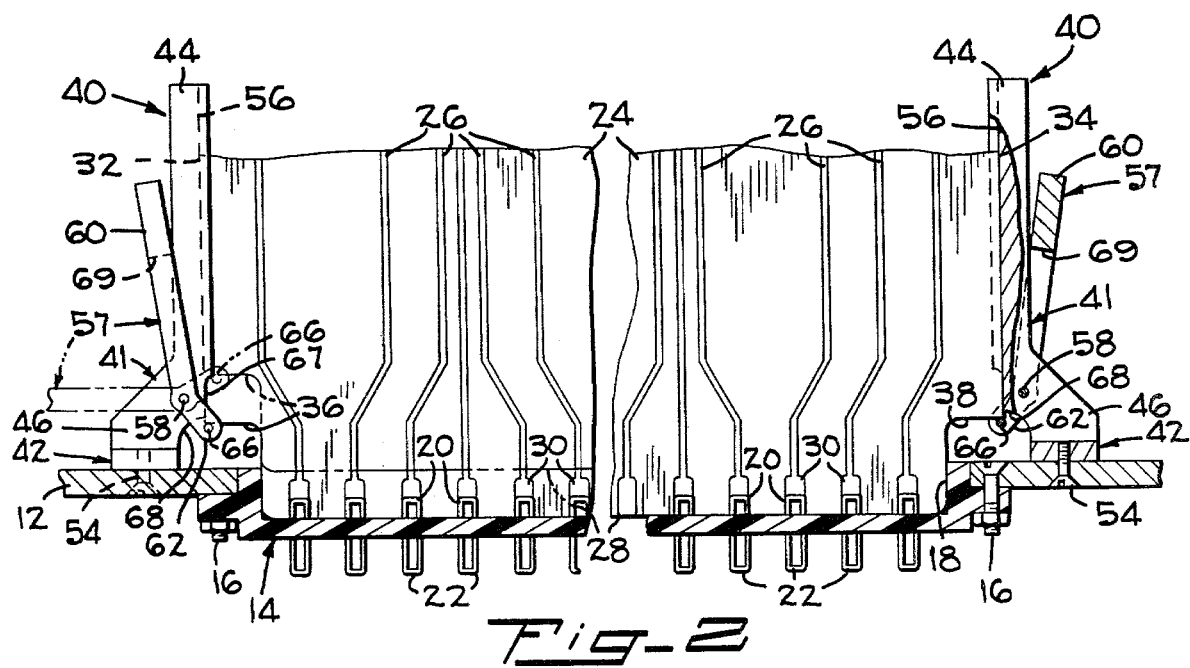

CIRCUIT BOARD EJECTOR AND GUIDE

BACKGROUND OF THE INVENTION

1. Field of the Invention

This invention relates to a device for ejecting circuit boards from circuit board connectors.

2. Description of the Prior Art

In producing electronic circuit boards it is typical after final assembly of each circuit board that the circuit board be subjected to an electrical test. Such testing is done by plugging the circuit board into a conventional connector which connector has terminals connected to appropriate test circuitry. When a person has many circuit boards to test and is under time pressure, removal of the circuit board from the connector after completion of tests can be a burdensome task and in certain instances can result in deformations of the board and/or the connector which may damage either the board or the test equipment.

SUMMARY OF THE INVENTION

In accordance with the present invention an ejector mechanism is provided for installation at each end of the circuit board connector. The ejector mechanism has a pivoting lever which can be operated, when the test is complete, to safely and positively disengage the board from the connector and afford rapid and easy removal of the circuit board.

Each ejector mechanism includes an upstanding elongate member that defines a channel groove for guiding the side edge of the circuit board into the test connector. The guide channels both facilitate insertion of the circuit board into the connector and support the circuit board after it has been disengaged from the connector by the ejector mechanism. Because the circuit board is supported after disengagement from the connector, the operator can use both hands during ejection so as to maintain alignment of the circuit board during ejection.

The ejector assembly includes a pivoting member which has an engaging member for engaging the circuit board. The device is configured so that the engaging member is in alignment with the channel groove at all times, whereby ejection can be accomplished without undue attention by the operator.

The foregoing together with other objects, features and advantages of the invention will be more apparent after referring to the following specification and the accompanying drawings.

BRIEF DESCRIPTION OF THE DRAWINGS

FIG. 1 is a perspective view of an ejector assembly embodying the invention.

FIG. 2 is an elevation view in partial cross section showing a circuit board, a circuit board connector and two ejector assemblies of the invention, portions being broken away to reveal certain internal details.

DETAIL DESCRIPTION OF THE PREFERRED EMBODIMENT

Referring more particularly to the drawings, reference numeral 12 indicates a fragment of a wall of a chassis or cabinet which houses test circuitry for a circuit board. The wall 12 defines an opening in which is mounted a conventional circuit board connector 14, screws 16 at opposite ends of the connector serving to retain the connector rigid with wall 12. Connector 14 defines an elongate slot 18 in which is supported a row of electrical contacts 20 that have extensions 22 which extend externally of connector 14 and afford connection of conductors to the respective contacts. Contacts 20 are of conventional form and typically have a U-shaped portion (not shown) which defines a space into which a circuit board is installed. The contacts have substantial elasticity so as firmly to engage the circuit board terminals, thereby providing electrical connection to the circuit board terminals as well as physical support to the circuit board.

In FIG. 2 there is illustrated a fragment of a circuit board 24. The circuit board has a plurality of conductors 26 to which are connected standard circuit elements, not shown. The conductors 26 terminate at an end edge 28 of the circuit board. At the terminal portions of conductors 26 adjacent edge 28 the conductors form relatively wide strip terminals 30 which cooperate with contacts 20 in connector 14. Circuit board 24 also has side edges 32 and 34 which are parallel to one another and are perpendicular to end edge 28. At the inner or lower extremities of side edges 32 and 34, that is, the extremities adjacent end edge 28, are cutouts which form shoulders or abutment surfaces 36 and 38. The abutment surfaces are spaced from end edge 28 and are parallel to the end edge.

An ejector assembly in accordance with the invention is identified at 40. The ejector assembly includes a body 41 having a base 42, an elongate portion 44 and an offset portion 46 between the base and the elongate portion. The base, offset portion and elongate portion are preferably integral with one another. Base 42 includes opposite laterally extending flanges 48 and 50 which form threaded holes 52 to receive mounting screws 54 and support the ejector assembly adjacent the end of connector 14 in alignment with slot 18.

Elongate portion 44 defines a channel groove 56 which extends the full length of the elongate portion. The channel groove has a width slightly greater than the thickness of circuit board 24 so as to slidably receive edges 32 and 34 of the circuit board therein. The channel groove has a depth less than the width of abutment surfaces 36 and 38 so that at least a portion of the abutment surfaces is without the channel groove.

A lever 57 is supported for pivotal movement on offset portion 46 by a pivot pin 58. Lever 57 has an outer handle portion 60 and a bifurcated inner end formed by furcations 62 and 64 through portions of which pivot pin 58 extends. As can be seen in FIG. 2, the furcations are spaced apart so that they can flank offset portion 46. The free ends of furcations 62 and 64 support an abutment engaging pin 66 which is positioned to engage abutment surfaces 36 and 38 of circuit board 24 and is parallel to pivot pin 58. The distance between engaging pin 66 and pivot pin 58 is less than the distance between the pivot pin and handle portion 60 so as to afford sufficient mechanical advantage that only moderate pressure of the handle portion suffices to eject the circuit board.

Referring to FIG. 2 it will be noted that the offset portion 46 forms a clear space between the base flanges and the end of channel groove 56 so that engaging pin 66 can move between the extremities shown at the left-hand side of FIG. 2. The clear space is bounded by a plane surface 67 that is substantially coplanar with the inner extremity of channel groove 56, and an arcuate surface 68 that extends from surface 67 into tangency with base 42. It will be noted that the length of the portion of furcations 62 and 64 between pivot pin 58 and engaging pin 66 is such that the engaging pin remains in contact with abutment surface 36 throughout all pivotal positions of lever 57. Thus even when the circuit board 24 is fully engaged within slot 18 of connector 14, engaging pin 66 (seen in the solid line position at the left-hand side of FIG. 2) is engaged with the abutment surface. It will be noted that handle portion 60 of lever 46 defines a transverse wall 69 between furcations 62 and 64 which acts as a stop to limit the degree of pivotal movement of the lever so as to assure that engaging pin 66 is never out of alignment with channel groove 56 and the abutment surface and to assure that there is sufficient space between the handle portion 60 and elongate portion 44 for the operator's thumb or finger.

In operation, a pair of ejector assemblies is installed on opposite ends of connector 14 by forming appropriately located pairs of holes in panel 12 at opposite ends of the connector for receipt of screws 54. The holes are positioned so that channel grooves 56 are in alignment with slot 18 of the connector and are spaced outward of the longitudinal extremities of the connector to support and guide side edges 32 and 34 of the circuit board. When wall 12 is horizontal as shown in FIG. 2, the ejector structures extend upward and the relatively massive handle portion 60 of lever 57 biases engaging pin upward to the position shown in broken lines at the left-hand side of FIG. 2. A circuit board is installed by sliding side edges 32 and 34 along channel grooves 56 of the respective devices until strip terminals 30 adjacent end edge 28 of circuit board 24 are mechanically and electrically engaged with contacts 20. It will be appreciated that insertion of the circuit board is facilitated by use of the present invention because the outer ends of channel grooves 56 are spaced away from connector 14 so that the circuit board side edges can be conveniently aligned therewith, and once so aligned, movement of the circuit board along the channel grooves guides end edge 28 of the circuit board into connector slot 18 without undue operator attention. Inward movement of the circuit board effects engagement between abutment surfaces 36 and 38 of the circuit board and engaging pins 66 of the respective ejector assemblies. When the circuit board is fully inserted into connector 14, levers 57 are pivoted upward as shown in solid lines in FIG. 2.

After electrical tests of the circuit board have been completed, the operator grasps handle portions 60 of respective levers 57 with the fingers or thumbs and moves the handle portion toward base 42 and toward panel 12 in a direction generally parallel to channel groove 56. Such action causes lever 57 to pivot about pin 58, which in turn causes engaging pin 66 to apply upward force against abutment surfaces 36 and 38 as to disengage strip terminals 30 on the circuit board from contacts 20 in connector 14. Because elongate portion 44 of each of the ejector assemblies has substantial length, the circuit board remains in an upright condition after disengagement from the contacts in connector 14, thus avoiding damage to the circuit board and the components mounted thereon. After the circuit board is disengaged from the connector and supported between elongate bodies 44, the operator need only raise the circuit board for full removal and storage.

Thus it will be seen that the ejector assembly of the present invention facilitates both connection and disconnection of the circuit board to connector 14 in a testing apparatus or the like. Insertion of the circuit board is facilitated because the channel grooves 56 are aligned with connector slot 18 and the outer ends of the channel grooves are spaced above panel 12 so as to be freely accessible to the operator. Ejection of the circuit board is facilitated because of the configuration of levers 57 and the fact that when the strip terminals 30 on the circuit board are disengaged from contacts 20 the board is still supported. Thus, the operator can use both hands on the respective levers 57 so as to disengage the circuit board rapidly and efficiently. Consequently, the circuit board can be subjected to such tests as are necessary without jeopardizing the integrity of the circuit board or the components mounted thereon.

In further description of a preferred embodiment of the invention, one ejector assembly designed in accordance with the invention has a body 41 of approximately 2.5 inches in length. Elongate portion 44 has a thickness of about 0.25 inch, the slot formed between furcation 62 and 64 having a corresponding width. Channel groove 56 has a width of about 0.042 inches and a depth of about 0.062 inches. In such exemplary structure the distance between pin 58 and the remote extremity of handle portion 60 of lever 57 is about 1.5 inches and the distance between the pivot pin and engaging pin 66 is about 0.187 inches. The portion of bifurcations 62 and 64 between pivot pin 58 and engaging pin 66 is established at an angle of about 150° from the portion of the bifurcations adjacent handle portion 60, the latter angle exemplifying an obtuse angle less than 180°. The radius at which arcuate surface 68 is formed is about 0.375 inches, and plane surface 67 has a vertical dimension of about 0.25 inch, thereby affording adequate clear space for engaging pin 66 to move without moving out of contact with the abutment surfaces of a circuit board supported in channel groove 56. The foregoing dimensions are intended to facilitate understanding of the invention and are not intended to limit the invention to any dimensions specified.

Although one embodiment of the invention has been shown and described, it will be obvious that other adaptations and modifications can be made without departing from the true spirit and scope of the invention.

What is claimed is:

1. A circuit board ejector for facilitating removal of a circuit board from a circuit board connector, said circuit board having an end edge, a plurality of conductive strip terminals adjacent the end edge, shoulder portions adjacent the end edge defining first and second abutment surfaces parallel to and spaced from said end edge, and first and second side edges extending from respective abutment surfaces and substantially perpendicular thereto, said connector forming a slot and having a plurality of contacts within said slot for frictionally engaging said strip terminals, said ejector comprising an elongate body and a base rigid with said body, means for affording attachment of said base adjacent on end of said connector, said body defining a channel groove for alignment with said connector slot, said channel groove having a width sufficient to slidably receive said first side edge therein so as to guide said circuit board therein, said channel groove having a depth less than said abutment surface, said body having an offset portion adjacent said base so as to form a clear space between said base and the inner end of said channel groove, a lever having a bifurcated portion defining two furcations that are spaced apart so as to flank said offset portion, said furcations having extremities, means including a pivot extending through said furcations remote from said extremities for mounting said lever to said body for pivoting movement about a pivot axis in said offset portion, a pin mounted on said furcations at said extremities and spanning the space there between to define an engaging portion remote from said pivot axis and disposed in said clear space in alignment with said channel groove for engagement with said first abutment surface, said lever having a handle portion opposite said engaging portion and accessible from the side of said elongate body opposite said channel groove so that application of force on said handle portion in a direction substantially parallel to said channel groove and toward said base causes said engaging portion to contact said abutment surface within said clear space and move said circuit board along said channel away from said connector slot.

2. A circuit board ejector according to claim 1 including a transverse wall on said lever between said furcations, said wall being disposed on the side of said pivot axis opposite from said extremities for contacting said elongate and for limiting the amount of pivotal movement of said lever so as to retain said pin in alignment with said abutment surface in all positions of said lever.

3. A circuit board ejector according to claim 1 wherein said furcations include inner furcation portions extending between said pivot axis and said extremities, said inner furcation portions residing at an obtuse angle to said handle portion.

4. A circuit board ejector according to claim 3 wherein said handle portion includes a transverse wall for contacting said elongate body at one extremity of pivotal movement of said lever, said transverse wall being spaced from said pivot axis by a distance such as to maintain said pin in longitudinal alignment with said channel groove when said transverse wall contacts said elongate body.

* * * * *